United States Patent [19]

Symersky

[11] 3,822,467

[45] July 9, 1974

[54] METHOD OF MANUFACTURING A SEMICONDUCTOR DEVICE HAVING A PATTERN OF CONDUCTORS AND DEVICE MANUFACTURED BY USING SAID METHOD

[75] Inventor: Bohuslav Symersky, Nijmegen, Netherlands

[73] Assignee: U.S. Philips Corporation, New York, N.Y.

[22] Filed: Apr. 25, 1973

[21] Appl. No.: 354,504

[30] Foreign Application Priority Data

Apr. 28, 1972 Netherlands .......................... 7205767

[52] U.S. Cl. .......................... 29/579, 29/591

[51] Int. Cl. .......................... B01j 17/00

[58] Field of Search .......... 29/578, 579, 589, 590, 29/580; 117/212

[56] References Cited

UNITED STATES PATENTS

| | | | |
|---|---|---|---|
| 3,438,121 | 4/1969 | Wanlass | 29/590 |
| 3,551,196 | 12/1970 | Herczog | 29/578 |
| 3,689,332 | 9/1972 | Dietrich | 117/212 |

*Primary Examiner*—W. Tupman

*Attorney, Agent, or Firm*—Frank R. Trifari

[57] ABSTRACT

A method of providing patterns of conductors on semiconductor device, in particular patterns which consist of layers of different materials. A metal auxiliary layer is used in which a negative reproduction of the desired pattern of conductors is provided. After providing the conductive layers necessary for the pattern, the excessive parts thereof are removed by the selective dissolution of the metal auxiliary layer. The method is of particular importance which patterns of conductors are used having one or more materials which cannot be etched or can be etched with difficulty only.

13 Claims, 8 Drawing Figures

METHOD OF MANUFACTURING A SEMICONDUCTOR DEVICE HAVING A PATTERN OF CONDUCTORS AND DEVICE MANUFACTURED BY USING SAID METHOD

The invention relates to a method of manufacturing a semiconductor device comprising the steps of providing a semiconductor body having on a surface thereof an insulating layer containing an aperture, a semiconductor zone located at the aperture and adjoining the semiconductor surface, the semiconductor body comprising a pattern of conductors which extends on the insulating layer and which is connected to the semiconductor zone via the aperture in the insulating layer, an auxiliary layer of a material differing from that of the pattern of conductors being provided on the surface of the semiconductor body, said auxiliary layer comprising one or more recesses in the form of the pattern of conductors to be provided, a layer of conducting material being then provided on the surface over the auxiliary layer and in the recesses, the part of the conductive layer present in the recesses of the auxiliary layer remaining on the semiconductor body as the pattern of conductors by removing the auxiliary layer and the part of the conductive layer present on the auxiliary layer.

The invention furthermore relates to devices manufactured by using such a method.

It has already been proposed, for contacting the base and emitter zones of a transistor, to maintain the photolithographic pattern, which has been used as an etching mask for etching the required contact apertures in the silicon dioxide layer present on the semiconductor surface, after said etching treatment on the surface and to vapour-deposit across said mask a layer of palladium and a layer of gold. The excessive parts of the palladium-gold layer are removed by dissolving the photolacquer layer pattern.

Because in this method the resulting metal contacts are present only on the semicondcutor surface in the contact apertures in the oxide layer, said method is not suitable for use in high frequency transistors. As a matter of fact, in high frequency transistors the dimensions of the base and emitter zone and hence also of the associated contact apertures are very small. Therefore, the metal contacts must extend from the contact apertures farther across the insulating layer so as to be able to connect further conductors thereto during assembly.

In integrated circuits also, the conductor tracks necessarily extend also on the insulating layer as well as in the contact apertures.

The demand for integrated circuits and circuit elements, for example transistors, for ever higher frequencies imposes ever higher requirements upon the available methods for providing fine patterns of conductors. In this connection it seldom deals with a further reduction of the details of the conductor pattern only. For example, the required adhesion to the substratum, the current densities occurring during operation, the electric series resistance which is still admissible, the electric properties of the contacts to circuit elements and the required stability and resistance to corrosion of the system used impose limits in choosing the materials to be used. Furthermore, it is necessary in connection with the way of providing the pattern of conductors in which one or more etching operations are often used, that the various materials used can be etched readily and selectively relative to each other.

A material which is frequently used for the pattern of conductors of semiconductor devices is aluminum which, in addition to a good etchability, shows a good adhesion to the semiconductor surface and to the insulating layers conventionally used for insulation and passivation and shows a comparatively low resistivity. Although aluminium conductor patterns satisfy in many respects the requirements imposed, serious problems may present themselves. One of the best known problems is related to the connection of the pattern of conductors to the remaining part of the device in which nearly always a junction of aluminium to gold is necessary as a conductor material. Aluminium and gold easily form intermetallic compounds as a result of which aluminium-gold junctions often are not sufficiently stable. In addition, electro-migration occurs in aluminum at higher current densities so that interruptions in the conductor tracks of the pattern may arise. Furthermore and in particular at slightly elevated temperatures, aluminium easily dissolves in silicon as a result of which, particularly upon contacting very shallow semiconductor zones of, for example, silicon high-frequency transistors, p-n junction which are situated just below the semiconductor surface can easily be damaged.

Also in connection with problems such as described above it has already been proposed to use patterns of conductors which are built up from layers of different metals. Known are, for example, patterns of conductors which consist of layers of titanium and gold or of titanium, platinum and gold present one on top of the other. The last-mentioned combination of materials is used in the so-called "beam-leads", which are thickneed gold parts of a conductor pattern which project laterally beyond the semiconductor body and serve for the electric connection.

From the above, which by no means is complete as regards the requirements to be imposed upon the pattern of conductors and the difficulties occurring during providing said patterns, it will nevertheless be obvious that in this case one has to do with an extremely important problem which is very complicated due to its many parameters and which plays an important part in semiconductor technology. It will furthermore be obvious that each of the existing solutions is based upon its own compromise in which the materials and treatments used in each of the said methods constitute a coherent entity the constituents being carefully chosen to be compatible to each other.

Both in the case of patterns of conductors which consist of one single layer, for example aluminium, and in patterns composed of layers of different metals, the conventional way of providing is that in which a continuous conductive layer is vapour-deposited on the relevant surface and is then shaped in the form of a pattern by means of an etching mask provided photolithographically in the usual manner. Not counting the restrictions imposed by the optical reproduction required and by the photochemical processes, the extent and the reproducibility of the underetching relative to the etching mask is decisive of the smallest dimension which can be realized in the pattern of conductors. Said underetching depends inter alia upon the quality of the adhesion of the conductive layer to the substratum and to the etching mask and upon the extent of selectivvity of the etchant for the conductive layer relative to the other materials which are simultaneously exposed to the etchant. Furthermore, in the case of a composite conductive layer, the uppermost metal layer, after having been etched, will serve as an etching mask for the subsequent metal layer, underetching occurring again.

It is the object of the present invention to provide a new method of providing conductor tracks in which the influence of underetching on the dimensions of the pattern of conductors is less considerable and with which fine details can more easily be realized in the pattern of conductors and in which the pattern of conductors may consist entirely or partly of materials which are difficult to etch or are difficult to etch selectively.

The invention is inter alia based on the recognition of the fact that upon providing fine conductor patterns by means of an auxiliary layer in which a negative reproduction of the desired conductor pattern is provided, attention is to be paid to obtaining a good separation between the part present on the auxiliary layer and the part of the conductive layer of the conductor pattern present in the recesses. For that purpose, the conductive layer a the edges of the recesses in the auxiliary layer must at least be very thin, so that fracture occurs easily at that area. Preferably, however, the two said parts of the conductive layer must remain entirely separated from each other already during providing the conductive layer. The invention is furthermore based on the recognition of the fact that it must be possible for the auxiliary layer to be patterned accurately and in addition to be removed readily after providing the conductive layer.

A method of the type described in the preamble is characterized according to the invention in that the auxiliary layer comprises a first and a second auxiliary layer of mutually different material in which a metal layer which is soluble substantially without the conductive material of the conductor pattern being attacked is used as the first auxiliary layer, said first auxiliary layer being present between the semiconductor surface and the second auxiliary layer, and in which, during making the recesses in the auxiliary layer, the recesses in the first auxiliary layer become larger, due to underetching, than the recesses in the second auxiliary layer.

Due to the said underetching, the edge of the second auxiliary layer will project over the edge of the first auxiliary layer, as a result of which the upright edges of the recesses in the auxiliary layers obtain a shape which seriously impedes connection of the parts of the conductive layer present on the auxiliary layer and in the recesses, or even makes such connection impossible.

It is of importance that a first auxiliary layer be used which consists of metal. Many metals are available in a sufficiently pure form to be able to satisfy the stringent requirements which apply in semiconductor technology with respect to avoiding contamination. In addition they can often be provided in a comparatively easy manner and with a previously determined thickness, for example by vapour-deposition or sputtering, and generally they do not present any problems in the presence in a vacuum, for example, by degassing or decomposition.

Furthermore, selective etchants for a large number of metals, alloys included, are known for patterning and/or removing. In patterning, the conventional photolithographic masking layers can be used.

An elevated substrate temperature may be used without objection in vapour-depositing the conductive layer for the pattern of conductors. At the same elevated temperature, which is often necessary to improve the adhesion of the conductor pattern to the substratum, the first auxiliary metal layer is non-deformable and stable and, or example, it seldom or never shows a tendency to cracking and/or becoming brittle.

Otherwise, an important advantage of the method according to the invention is that, in particular when the second auxiliary layer is also a metal layer, there exists a greater freedom in the choice of the substrate temperature during the provision of the conductive layer for the pattern of conductors. This substrate temperature is of great influence on the adhesion of the pattern of conductors to the insulating layer and in the contact apertures on the semiconductor surface and is moreover important for the electric properties of the metal-to-semiconductor interface. In the conventional method the substrate temperature chosen is often a compromise determined by the influence on the adhesion to the insulating layer. The adhesion to the insulating layer is as a matter of fact not allowed to be so good that when the conductive layer is etched to form a pattern, the complete removal of the excessive parts of the conductive layer is seriously impeded or even made impossible.

Parts of the semiconductor surface in apertures in the insulating layer are preferably exposed prior to the provision of the auxiliary layer.

In the method according to the invention, the conductive layer contacts the semiconductor surface and the insulating layer only in those places where the pattern of conductors is ultimately desired. The adhesion between the conductive layer and the auxiliary layer during the removal plays substantially no part, because the removal is not carried out by etching away the conductive layer but by dissolving an underlying layer. When the auxiliary layer is provided, a lower substrate temperature will usually be sufficient because the most important requirement imposed upon the adhesion between the auxiliary layer and the insulating layer is that it is sufficient to accurately pattern the auxiliary layer.

Dissolving of an auxiliary layer, in spite of said layer being covered at least for the greater part by the conductive layer, can be carried out comparatively rapidly because, in choosing the solvent, the adhesion of a (photolighographic) etching mask and controlling the extent of underetching need not be taken into account, so that in that case a rapidly acting etchant may be used. In addition, when the materials of the auxiliary layers are conductive, a primary cell is easily formed since the auxiliary layers and the conductive layer are simultaneously and in direct electric contact with each other in the solvent. With a suitable choice of the materials, the dissolution of the first and/or the second auxiliary layer can thus be considerably accelerated.

This same effect of the accelerated dissolution by the formation of a primary cell occurs in the so far commonly used method when patterns of conductors are used which consist of a composite layer. Underetching of the lowermost metal layer then easily and readily occurs as a result of which, notably in the case of fine patterns of conductors, serious difficulties arise. Since the lowermost metal layer is usually covered by an opaque layer, the extent of underetching is not visible and hence substantially unreliable. The result is a relatively high reject percentage in the production. In addition, the lowermost metal layer usually serves to prevent a direct contact between the overlying metal layer and the semiconductor surface. For that reason also it is less desirable that the lateral dimensions of the lowermost metal layer are smaller than those of the overlying metal layer.

When using the metal according to the invention in which the conductive layer is not patterned by etching this layer, these problems caused by underetching do not occur. Therefore, the use of the invention is of particular advantage in the case of patterns of conductors which are built up from several layers and an important preferred embodiment of the method according to the invention is therefore characterized in that the surface of the body with the overlying patterned auxiliary layer is provided with a composite conductive layer by the successive provision of at least two layers of a conductive material differing from each other.

The lowermost of these layers which is nearest to the surface of the body preferably consists of titanium, chromium, rhodium, zirconium, cobalt, tungsten or tantalum. The uppermost of said layers preferably consists of gold. Notably titanium, chromium, tungsten and tantalum, paticularly when they are provided at elevated substrate temperature, give metal-to-semiconductor contacts having good electric properties. The said materials readily adhere to the usual insulating layers, for example, silicon dioxide and/or silicon nitride. Moreover, they readily screen the overlying gold from the semiconductor surface, provided the layer is of a sufficient thickness.

In a further preferred embodiment of the method according to the invention, a platinum layer or a rhodium layer is provided prior to the provision of the gold layer but while a layer of titanium, chromiun or zirconium is already present. Due to the invention, the use of platinum is considerably simplified, notably due to the fact that the platinum layer need not be etched. The lack of suitable selective etchants and the fact that back-sputtering or sputter-etching often has drawbacks has so far mainly hampered the practical use of platinum in patterns of conductors.

A further important advantage in the scope of the invention is that platinum and rhodium form a better barrier for the gold than titanium or chromium, so that in comparison with titanium or chromium a good protection of the gold relative to the semiconductor surface can be ensured with a considerably thinner layer. The titanium or chromium layer then serves as an adhesive layer for the platinum or the rhodium. When a platinum intermediate layer is used, the overall thickness of the composed conductor layer may be smaller than in the case of a titanium-gold or a chromium-gold layer, which, as will be explained in greater detail hereinafter, enables to obtain finer details in the pattern of conductors.

Other good diffusion barriers for the screening of the gold layer from the semiconductor are molybdenum, zirconium cobalt, tungsten and tantalum of which in particular the last material readily adheres to the usual insulating layers so that no adhesive layer is necessary.

Upon providing the conductive layer, a local source of material, as in the case of vapour deposition and sputtering, is preferably used, the position of said source relative to the surface with the pattern auxiliary layer being chosen to be so that during the provision the transport of material from the source to the body takes place mainly in a direction substantially perpendicular to the surface.

When a composite conductive layer is provided, the position of the local source of the material to be provided relative to the surface with the patterned auxiliary layer is advantageously chosen to be substantially the same during the provision of the various layers. In this manner, the edges of the recesses in the auxiliary layer are reproduced as sharply as possible and as equally as possible in the successive layers of the composite conductive layer.

A further preferred embodiment of the method according to the invention is characterized in that an auxiliary layer is used having a thickness which is at least equal to that of the conductive layer. The thickness of the auxiliary layer is preferably larger than that of the conductive layer. In this manner, the conductive layer at the area of the edges of the recesses in the auxiliary layer will be extremely thin and in most of the cases be even entirely interrupted, so that the removal of the excessive parts of the conductive layer is facilitated.

In an important preferred embodiment of the method according to the invention the layer which is provided as a second auxiliary layer is thinner than the first auxiliary layer. According as the second auxiliary layer is thinner, recesses can be provided in said layer with a greater accuracy and with small details. That underetching occurs subsequently upon etching the underlying first auxiliary layer is of minor importance in this connection because the boundary of the part of the conductive layer present in the recess, so of the pattern of conductors, is determined by shadow effect mainly by the edge of the aperture in the second auxiliary layer, provided, of course, the second auxiliary layer is not so thin that the projecting edge bends. Therefore, when a metal second auxiliary layer is used, the thickness thereof preferably is at least equal to approximately 1,000 A.

The invention will now be described in greater detail with reference to a few embodiments and the accompanying drawing, in which.

Figure 1:
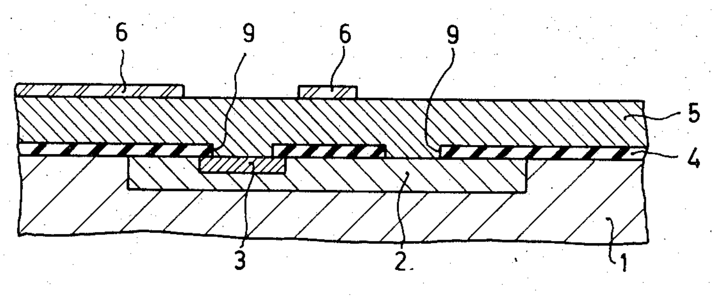
FIGS. 1 to 3 are diagrammatic cross-sectional views of a semiconductor device in various stages of manufacture.
Figure 2:
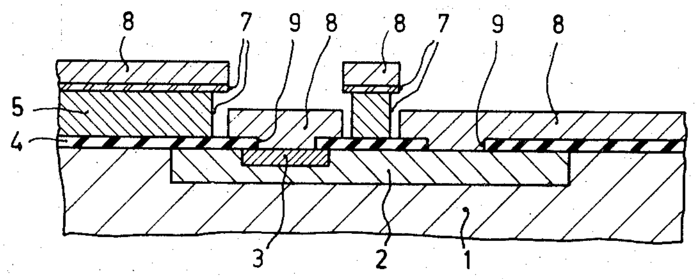

The manufacture of a transistor will first be described with reference to FIGS. 1 to 3. FIG. 1 shows a part of a semiconductor body 1 in which two surface zones 2 and 3 extend. The semiconductor regions 1, 2 and 3 are of alternate conductivity types and belong to the collector, the base and the emitter, respectively, of a bipolar transistor. Furthermore, said semiconductor regions adjoin an insulating and passivating layer 4, as is usual.

The semiconductor body described thus far can be manufactured entirely in the usual manner, in which the conventional doping techniques, such as diffusion nd ion implantation, and the conventional photoetching and masking methods can be used.

The emitter zone 3 and the base zone 2 must be provided with an electric connection, for which purpose a conductor pattern is usually provided. FIG. 1 shows that a first auxiliary layer 5 of metal is provided on a surface of the body 1, 2, 3, 4 in which metal layer 5 recesses are provided, for example, by means of a photolacquer layer pattern 6 and an etching treatment. The shape of the recesses 7 (FIG. 2) which are provided in the first and the second auxiliary layer 5 and 6 corresponds to that of the ultimately desired pattern of conductors, in other words, a negative reproduction of the pattern of conductors is provided in the auxiliary layer 5, 6.

A conductive 8 is then provided across the patterned auxiliary layer 5, 6. Said layer covers the auxiliary layer 5, 6 and is moreover present in the recesses 7.

The excessive parts of the conductive layer 8, that is to say those parts which are present on the auxiliary layer 5, 6 are removed by dissolving the first auxiliary layer 5 in a bath in which the material of the first auxiliary layer 5 is readily soluble but which does not or substantially does not attack the material of the conductive layer 8. Just like the excessive parts of the conductive layer 8, the second auxiliary layer 6 then also disappears.

Figure 3:
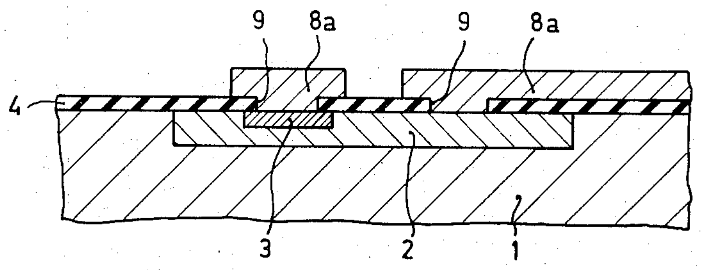

After this operation, the parts 8*a* of the conductive layer 8 which together form the desired pattern of conductors, remain on the surface of the body (FIG. 3).

It is of importance that the auxiliary layers can be easily provided and that readily defined recesses can simply be provided in it while furthermore the auxiliary layers during the various operations of manufacture must behave in a readily defined manner and without introducing problems. The pure metals and also alloys usually have to a high extent, the properties which are desired in this respect. This group of materials can generally be provided easily, for example, by vapour-deposition or sputtering, while in addition in nearly all the cases selective etchants which can be used for patterning and the ultimate dissolution are known and available. In addition, said materials can be very pure and contain few or no impurities, which may be necessary notably in the manufacture of semiconductor devices. Furthermore, said materials from stable, readily defined layers which are sufficiently temperature-resistant to remain sufficiently non-deformable also even at elevated temperature, show no decomposition phenomena and generally cause no problems in a vacuum either.

The method according to the invention can be used in the manufacture of several types of semiconductor devices, for example, diodes, transistors and integrated circuits, in which a pattern of conductors is used for contacting and/or mutual interconnection of circuit elements. In semiconductor devices, the provision of the pattern of conductors in the so far usual manner presents problems in particular when the pattern of conductors comprises tracks having the minimum realisable widths. Such tracks of minimum widths are necessary, for example, in semiconductor devices for high frequency applications and apart from the frequency behaviour, also, for example, in integrated circuits in connection with the space available at the surface.

In the example, apertures 9 are provided in the insulating layer 4, through which apertures 9 there are accessible the semiconductor zones 2 and 3, which extend up to the semiconductor surface, and via which apertures 9 the ultimate conductor pattern 8*a* is connected to said semiconductor zones. The apertures 9 are smaller, at least in one direction, than the recesses 7 in the auxiliary layer 5, 6, so that the ultimate conductor track 8*a* extends from the apertures 9 across the insulating layer 4.

Furthermore, the apertures 9 can be provided after the patterned auxiliary layer 5, 6 has been provided on the surface but they are advantageously provided prior to the provision of the first auxiliary layer 5. If necessary, after patterning the auxiliary layer 5, 6 and prior to providing the conductive layer 8, a short etching treatment, for which usually no special etching mask will be necessary, may be carried out to thoroughly clean the apertures 9 and, for example, to remove an oxide skin, if any. The layer still to be removed from the apertures 9 will usually be considerably thinner than the insulating layer 4 which is necessary in particular when etching is carried out without a mask with an etchant in which the material of the insulating layer 4 is also soluble. For example, the aperture 9 above the base zone 2 may be opened prior to providing the auxiliary layer, after which in the above short etching treatment, the aperture 9 above the emitter zone is formed by reopening the aperture through which the doping of the emitter zone has been provided.

It will be obvious from the above that for the removal of the excessive parts of the conductive layer 8 a separation between said parts and the pattern of conductors 8*a* is necessary, in which said separation must follow the edges of the recesses 7 as much as possible. When the conductive layer 8 is sufficiently thin and/or brittle and the distance between the tracks of the pattern of conductors is not too small, said separation may occur during and/or after the removal of the auxiliary layer 5, 6 by breaking in which, if required, ultrasonic vibrations may be used.

Particularly when the conductive layer is provided, for example, by vapour-deposition or sputtering, it may be ensured that the conductive layer 8 at the area of the edges of the recesses 7 is thin or even entirely interrupted. In this connection it is also recommendable, in particular in the case of patterns of conductors having small dimensions, for example, tracks having a width of a few $\mu$m which lie at a mutual distance of the same order of magnitude, to use an auxiliary layer 5, 6 the thickness of which is at least equal to that of the conductive layer 8.

When the conductive layer 8 consists entirely or partly of very ductile materials, for example gold, said materials may be made more brittle by the addition of small quantities of other materials, for example, during the vapour-deposition process. For that purpose, for example, traces of arsenic, boron or nickel may be added to gold.

The insulating layer 4 in the present example consists ofsilicon dioxide and/or silicon nitride. Copper or silver may be used for the first auxiliary layer 5, in which the adhesion between such a layer and the insulating layer 4 can be improved by first providing a thin adhesive layer, for example of titanium, chromium or, as in the present case, aluminium Such an adhesive layer preferably has a thickness between approximately 0.01 and approximately 0.15 $\mu$m. If desired, said adhesive layer may be removed from the recesses 7 prior to the provision of the conductive layer 8, in this case also of aluminium.

The first auxiliary layer may then be dissolved in nitric acid and the underlying adhesive layer may be removed, if necessary, for example by oxidation or dissolution. The aluminium adhesive layer has a thickness, for example, of approximately 300 to 500 A, the thickness of the first auxiliary layer being, for example, approximately 1.5 $\mu$m and that of the conductive layer, for example, approximately 1 $\mu$m.

Figure 4:
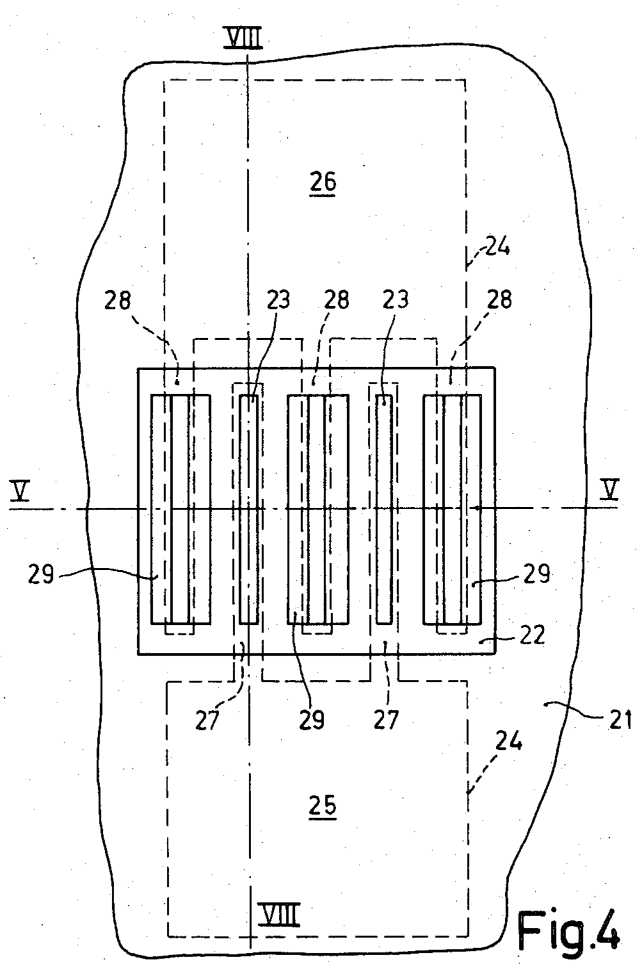
FIG. 4 is a diagrammatic plan view of another semiconductor device.

The second embodiment relates to the manufacture of a planar high-frequency transistor a diagrammatic plan view of which is shown in FIG. 4. Said transistor comprises a collector zone 21, a base zone 22 and two emitter zones 23. Furthermore, a pattern of conductors 24 is shown diagrammatically in broken lines and comprises contact pads 25 and 26 for the adhesion of connection conductors for the emitter and base, respectively, said contact pads each comprising a number of extensions or fingers 27 and 28, respectively, which are connected to the emitter zones 23 and the base zone 22, respectively. Contact zones 29 which belong to the base zone 22 and serve inter alia to reduce the base-series resistance extend below the base fingers 28 in the semiconductor body.

The dimensions of the emitter zones are, for example, 40 $\mu$m × 1.5 $\mu$m. The area of the base zone is, for example, approximately 45 $\mu$m × 31.5 $\mu$m. The contact zones 29 are, for example, 40 $\mu$m long and 5 $\mu$m wide. The width of the fingers 27 and 28 is approximately 2 $\mu$m and the distance between two adjacent fingers 27 and 28 is approximately 4 $\mu$m.

Figure 5:
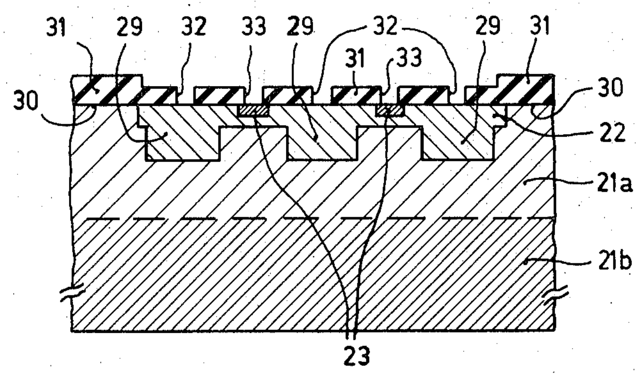
FIGS. 5 to 8 are diagrammatic cross-sectional views of said device in various stages of manufacture.

The cross-sectional view shown in FIG. 5 shows that the collector zone 21 consists of a low-ohmic substrate 21*b* and a high-ohmic epitaxial layer 21*a* of the same conductivity type.

Th contact zones extend down to a depth of approximately 1 $\mu$m below the semiconductor surface 30. The remaining part of the base zone 22 has a thickness of approximately 0.3 $\mu$m. The emitter zones 23 are present in the thin part of the base zone 22 and are approximately 0.15 $\mu$m deep.

An insulating layer 31 comprising apertures 32 and 33 having dimensions of approximately 40 $\mu$m × 1.5 $\mu$m for contacting the base zone and emitter zones, respectively, is present on the semiconductor surface.

In this case also, the structure as described thus far can be obtained while using conventional methods.

Figure 6:
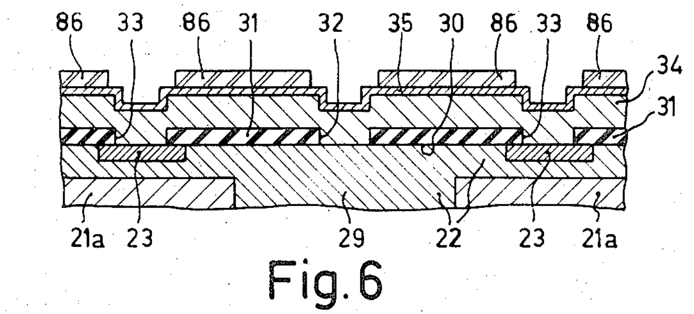

FIG. 6 shows a part of the cross-sectional view shown in FIG. 5 on an enlarged scale for reasons of clarity. According to the invention, a first auxiliary layer 34 which in this case consists of an approximately 1 $\mu$m thick aluminium layer, is provided on the surface. A second auxiliary layer 35 which consists of chromium and has a thickness of 0.1 to 0.2 $\mu$m is provided on said first auxiliary layer 34. A pattern 86 in the form of a layer of photolacquer with which an accurate negative reproduction of the desired pattern of conductors in the chromium layer 35 can be obtained, is provided on the second auxiliary layer 35. The second auxiliary layer 35 is so thin that little underetching occurs so that the apertures etched in said layer are readily defined and, as regards their dimensions, do substantially not differ from the apertures in the photolacquer layer pattern 86.

Figure 7:
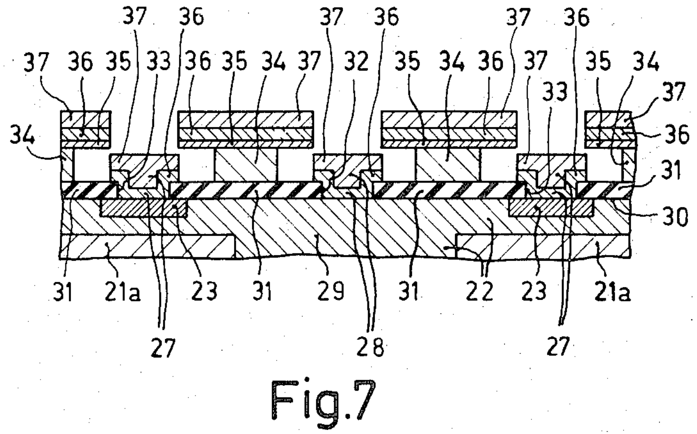

The first auxiliary layer 34 is then etched, the patterned second auxiliary layer 35 serving as an etching mask. Significantly noticeable underetching occurs because the first auxiliary layer 34 is considerably thicker than the second 35 (FIG. 7). The second auxiliary layer must be so thick that the projecting edges do substantially not bend. Therefore, the second auxiliary layer preferably has a thickness of at least 0.1 $\mu$m. The upright edges of the apertures in the auxiliary layers 34, 35 now have a more or less U-shaped profile which, if necessary, can be deepened by prolonging the etching treatment of the auxiliary layer 34 so as to increase the extent of underetching The photolacquer layer pattern 86 is thoroughly removed at will after etching of the second auxiliary layer 35 or after etching of the first auxiliary layer 34, and preferably prior to the provision of the conductive layer. In the latter case, no organic residues will remain on the surface, which, as is known, may sometimes cause adhesion problems and may also sometimes adversely influence the electric properties of metal-to-semiconductor interfaces.

Before providing the definite metallisation the apertures 32 and 33 in the insulating layer 34 may be cleaned. For example, etching is carried out for a few seconds in a buffered HF—$(NH_4)$F-solution to remove any oxide skin from said apertures. During this treatment, for which no masking layer need be provided, the oxide layer formed during the diffusion of the emitter zones 23 in the diffusion windows may also be removed from said windows. In that case the contact apertures 33 for the emitter zones 23 are substantially identical to the diffusion windows used for said zones 23.

A layer 36 of titanium is then provided. This is preferably carried out under reduced pressure by vapour deposition or sputtering. During said treatment, the semiconductor body is heated to a temperature of approximately 300°C so as to ensure a good adhesion between the titanium on the one hand and the semiconductor surface and the insulating layer 31 on the other hand. The thickness of the titanium layer 36 is approximately 0.4 $\mu$m.

An approximately 0.8 $\mu$m thick gold layer 37 is provided over the titanium layer 36 in a corresponding manner.

Figure 8:
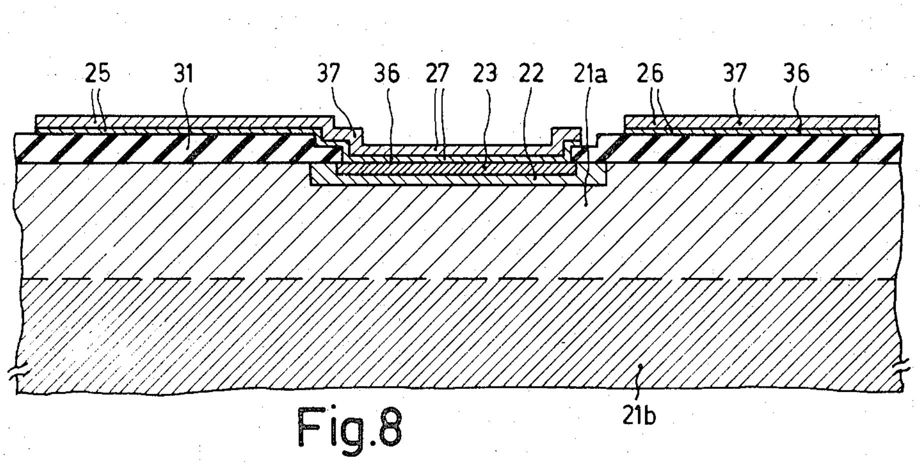

For dissolving the aluminium layer 34, the body is dipped for a few minutes in a solution which contains, for example, HCl and $FeCl_3$. In this case, a fast acting etchant may be used because no pattern need be etched. In the latter case, actually, etching solid should have to be carried out in a well controlled manner and hence slowly in view of the underetching. The body may then be cleaned, for example, under a jet of water. The parts of the layers 35, 36, 37 originally present on the aluminum layer 34 are now removed and only the parts of the composite conductive layer 36, 37 present in the recesses of the auxiliary layers 34 and 35 remain on the body. FIG. 8 is a cross-sectional view of the device in this stage of the manufacture, said cross-section being taken on the line VIII—VIII of FIG. 4.

The semiconductor device may be further treated in the usual manner and, for example, be assembled and provided with an envelope. Gold wires for the emitter and base may be provided on the contact pads 25 and 26. The collector zone 21*a*, 21*b* may be contacted on the lower side, for example, by soldering on a conductive bottom or pin of the envelope.

As already stated, it is desirable, in particular in the case of patterns of conductors having small dimensions, that the conductive layer, after providing, be very thin and preferably even discontinuous at the area of the edges of the recesses. In connection herewith, the conductive layer is preferably provided from the gaseous phase under a reduced pressure and with the use of a local source of material, for example, by vapour deposition or sputtering. In particular when the transport of material during providing the conductive layer takes place mainly in a direction substantially perpendicular to the surface to be covered, the recesses of the auxiliary layer are readily reproduced in the conductive layer and the conductive layer will be extremely thin or entirely interrupted due to the projection of the second auxiliary layer at the area of the edges of the recesses.

It has proved advantageous in this respect to use an auxiliary layer in such manner that the thickness of the first auxiliary layer or the collective thickness of the auxiliary layers is approximately equal to or larger than the thickness of the conductive layer.

When a composite conductive layer is used, the relative position of the source of material relative to the surface to be covered is preferably chosen to be equal as much as possible for the various layers to be provided, as a result of which the shadow effect of the edges of the recesses of the auxiliary layer is substantially the same for said different layers and the pattern of conductors obtains particularly taut edges in which the lateral dimensions and the position of the various layers of the conductor pattern are accurately equal to each other, and at least the perpendicular projections on the surface of layers farther remote from the surface do not fall beyond the projection of the lowermost layer present most adjacent the surface.

It will be obvious that, according as the interruption of the conductive layer on the edges of the pattern in the auxiliary layer is more complete, the dissolving of the auxiliary layer is easier. In this connection, the U-shaped profile of the upright edges of the auxiliary layer, as it is achieved with a comparatively thick first auxiliary layer and a comparatively thin second auxiliary layer which serves as an etching mask for the first auxiliary layer, has a particularly favourable effect. It is also possible to provide the recesses by back-sputtering. As is known, substantially no underetching or at least far less underetching occurs in said back-sputtering or sputter etching than when an etching liquid is used. This latter is also of advantage in the scope of the invention, notably when the mutual distance between adjacent parts of the pattern of conductors is comparatively small, as will be explained in more detail.

A photolacquer layer pattern may be used as a masking layer in sputter-etching. During etching, said photolacquer layer becomes warm. In the so far used metallisation processes, the becoming heated of photolacquer layers is detrimental because, as is known, photolacquer layers are extra difficult to remove after heating. Within the scope of the invention, sputter-etching is used for patterning the auxiliary layer. So after sputter-etching, the remainders of the photolacquer layer are present on the auxiliary layer as a result of which they simply disappear simultaneously with the excessive parts of the conductive layer by dissolving the auxiliary layer. Furthermore it is of importance that, for example, aluminium can more easily be etched by back-sputtering than titanium and platinum.

Another drawback for using sputter-etching instead of chemical etching in the conventional metallisation processes is that the excessive parts of the conductive layer have to be etched away down to the insulating layer. In sputter-etching, damage to said insulating layer can easily occur and in addition charge can be incorporated in it, as a result of which the electric properties of the device can easily be deteriorated.

When using sputter-etching within the scope of the invention, said effects can simply be prevented by stopping the sputter-etching before the recesses in the auxiliary layer are completed. The recesses can be further opened by chemical etching. With this treatment the desired underetching of the first auxiliary layer with respect to the second is obtained. So in this manner a more or less U-shaped profile of the upright edges is also obtained which has a favourable effect with regard to the interruption in the conductive layer. Thus, by using sputter etching, comparatively small mutual distances in the pattern of conductors can be realized even with a comparatively thick auxiliary layer.

In order to further facilitate the dissolution of the auxiliary layer and when the available space permits this, more recesses can be made in the auxiliary layer than is strictly necessary for the pattern of conductors. Another possibility is to locally screen the patterned auxiliary layer during the provision of the conductive layer with a mask so that the auxiliary layer remains partly uncovered.

During the dissolving of the auxiliary layer, various metals of the auxiliary layer and the conductive layer may be in directed electric contact with each other in the bath used. The dissolving of the auxiliary layer may occur particularly rapidly under the influence of the primary cell which is formed due to the presence of said various metals. In the so far usual method this effect also occurs when patterns of conductors of composite layers are used and in that case it is particularly detrimental because it accelerates the underetching of the underlying layers of the pattern of conductors itself and makes same more uncontrollable.

As stated, the thickness of the auxiliary layer is preferably at least equal to that of the conductive layer. However, upon making the recesses in the auxiliary layer, more underetching will occur according as the auxiliary layer becomes thicker. It has been described in the second example how the influence of said underetching on the dimensions of the tracks of the pattern of conductors can be substantially avoided by using a comparatively thin second auxiliary layer. In that case, however, the problem remains that said underetching imposes a lower limit upon the minimum realizable mutual distance between adjacent tracks of the pattern of conductors. Actually, parts of the auxiliary layer 34 (FIG. 7) must remain between the base finger 28 and the adjacent emitter fingers 27. Particularly in the case of small distances between the tracks it is therefore of importance that the thickness of the auxiliary layer is not chosen to be larger than is actually necessary. This means that the thickness of the conductive layer also must preferably be maintained as small as possible. All this also applies in the case in which the auxiliary layer is patterned by back sputtering, although to a smaller extent because less underetching occurs in sputter-etching.

The titanium layer 36 in the second example is approximately 0.4 $\mu$m thick. In this case it plays a part that said layer serves inter alia as a barrier between the semiconductor material and the gold layer 37. A material which forms a much better barrier is platinum. Platinum, however, cannot substantially be etched selectively and can therefore not readily be used in the conventional known method. The present invention provides an attractive method which is simple to perform and in which platinum can indeed be used as a barrier. Moreover, in the scope of the present invention platinum has the advantage that the overall thickness of the conductive layer can be smaller. The Ti-Au layer described in the second example may, for example, be replaced by a composite conductive layer consisting of approximately 300A titanium which serves as an adhesive layer, an approximately 1,500 A thick platinum layer which forms the required barrier and an approximately 0.8 $\mu$m thick gold layer. The overal thickness of the conductive layer thus comes down to less than 1 $\mu$m instead of approximately 1.2 $\mu$m.

When tantalum is used as a barrier, no adhesive layer is necessary so that the titanium layer may then be omitted. Moreover, tantalum is very suitable as a barrier because, just as in the case of platinum, a very thin layer is already sufficient to prevent that in the desired temperature range the gold can reach the semiconductor by a diffusion through the tantalum layer and thus adversely influence the electric properties of the device. Furthermore, the resistance to corrosion of tantalum is very good.

Rhodium may be used both as a barrier and as a conductor in which, in the case of a sufficient thickness, only a thin thin layer of gold is necessary which only serves to facilitate making further connections, for example, during assembly. For example, a composite conductive layer may be used which consists of approximately 0.1 $\mu$m titanium, 0.5 to 0.6 $\mu$m rhodium and 0.05 $\mu$m Au. Furthermore, the adhesion of rhodium to the usual insulating layers is considerably better than is the case, for example, with platinum, so that, if desirable, the titanium layer may be omitted when using rhodium as a barrier and/or as a conductor.

Another advantage of the invention is related to the fact that a plurality of semiconductor devices are usually manufactured simultaneously in the same semiconductor wafer, which wafer is subdivided into individual devices in one of the last stages of the manufacture, usually by scribing and breaking. It is usual to remove, at the latest during the opening of the contact windows, also the insulating layer at the area of the scribing lanes so as to check excessively rapid detrition of the chisel used during scribing. In the usual method of metallisation, the titaniumgold layer contacts the semiconductor surface also in said scribing lanes where it alloys with the semiconductor just as in the contact windows on the zones to be contacted. On the one hand, high-quality metal-semiconductor junctions are formed in the contact apertures due to said alloying, on the other hand it becomes so difficult to remove the metal in the scribing lanes that extra detrition of the chisel in scribing is substantially unavoidable. When using the invention, the scribing lanes can simply be covered by the auxiliary layer so that the conductive layer cannot contact the semiconductor surface at that area. This applies notably if the apertures in the insulating layer are provided prior to the provision of an auxiliary layer on the surface.

If necessary, the adhesion of the various applied layers can be improved by the interposition of a thin adhesive layer which may consist, for example, of aluminium titanium or chromium. Also, upon contacting semiconductor devices, a thin extra layer may be provided below the conductive layer to improve the contact properties. For example, a layer of platinum silicide, palladium silicide or cobalt silicide may be provided in the contact apertures 9 in the insulating layer 4 (FIG. 3) before the conductive layer 8$a$ is provided. Palladium silicide and cobalt silicide, for example, may be provided by sputtering directly preceding the conductive layer.

Below a conductive layer of titanium-gold or titanium-platinum-gold, for example, a thin layer of aluminium from 100 to 1,000 A may be used. In that case, when an aluminium auxiliary layer is used, slight underetching of the thin aluminium contact layer may occur. Said underetching may be prevented, for example, by successively providing aluminium titanium and gold at a substrate temperature of approximately 200 to 300°C, the aluminium being approximately 100 to 300 A thick, and then using an afterheating at approximately 300 to 400°C of, for example, approximately 30 minutes. The resulting conductive layer is substantially not attacked upon etching away the aluminium auxiliary layer in a solution of HCl and $FeCl_3$.

The removal of the aluminium layer may also be carried out by an etching treatment with lye, in particular sodium hydroxide solution. The dissolution of the auxiliary layer can be accelerated by locally leaving the auxiliary layer uncovered, for example at the edge, or locally removing the conductive layer before the treatment with lye.

It will be obvious that the invention is not restricted to the examples described, but that many variations are possible to those skilled in the art without departing from the scope of this invention. For example, when a composite conductive layer is used the surface to be covered during the provision of one or more layers of the conductive layer may be screened partly with a mask so that the pattern of conductors, for example, is partly constructed from a single layer and elsewhere is constructed from several layers. Furthermore, other materials may be used. In addition to the already mentioned aluminium, copper and silver for the (first) ayxuiliary layer are to be considered, for example, magnesium, manganese, lead and indium. In addition to photolacquer or chromium are to be considered as the second auxiliary layer, for example, molybdenum, tungsten, palladium or nickel. Generally, the second auxiliary layer will serve in particular to obtain a good deposition of the edges of the recesses in the auxiliary layer, while the thickness of the auxiliary layer can be adapted to the thickness of the conductor pattern to be provided by means of the thickness of the first auxiliary layer. When a photolacquer layer is used as a first auxiliary layer it may be of advantage in connection with the desired non-deformability to provide between said layer and the second auxiliary layer a thin metal layer in a thickness of at least 0.1 $\mu$m. In order to remove the part of the conductive layer present on the auxiliary layer, preferably the thicker of the auxiliary layers used, so usually the first auxiliary layer, is dissolved. However, it is also possible to dissolve for that purpose the first or at least one of the other auxiliary layers. The remaining part of the auxiliary layer may then be etched away, which may be carried out with a fast-acting or if wanted with a slow-acting etchant, because said remaining part is then entirely exposed and can be etched simultaneously throughout its surface. As conductive materials for the conductive layer are generally to be considered metals and/or their conductive oxides and/or alloys. For the first layer of a composite conductive layer may be used, for example, chromium, titanium, tantalum, molybdenum, zirconium, rhodium, tungsten, vanadium or cobalt. The second layer may consist, for example, of aluminium, gold, platinum, tantalum, molybdenum, palladium, zirconium, rhodium, tungsten, vanadium, cobalt, nickel, chromium or nickel-chromium, while, if required, a third layer may be used, consisting, for example, of nickel or gold. With reference to the data and examples provided, those skilled in the art can simply compose from the said groups of materials an adapted combination dependent upon the properties desired for the pattern of conductors.

When a composite conductive layer is used and, for example, when the thickness thereof is such that the breaking at the edges of the recesses may run off with greater difficulty than is desired, the uppermost layer or layers of the conductive layer may be patterned entirely or over part of their thickness by means of a further mask. Besides by vapour deposition or sputtering, the various layers may also be provided, for example, electro-chemically, in which it is possible, for example, after the dissolution of the auxiliary layer, to further reinforce the pattern of conductors by "electroless" deposition and/or to provide one or more further layers of a different conductive material.

What is claimed is:

1. A method of manufacturing a semiconductor device comprising aconductor pattern, said method comprising the steps of:

a. providing a semiconductor body comprising at a surface thereof an insulating layer that comprises an aperture, said semiconductor body comprising a surface portion that comprises a semiconductor zone and said surface portion being accessible through said aperture;
b. providing on the surface of said insulating layer an auxiliary layer consisting essentially of material differing from that of said conductor pattern, said auxiliary layer comprising at least one recess having a predetermined configuration substantially corresponding to that of said pattern of conductors that is subsequently provided, said auxiliary layer comprising first and second sub-layers of mutually different material, said first sub-layer consisting essentially of a metal layer which is preferentially soluble in a predetermined reagent with respect to said conductor pattern and being present between said insulating layer and said second sub-layer, a first part of the recess defined by said first sub-layer being larger, due to underetching, than a second part of said recess defined by second sub-layer;
c. providing on said semiconductor body a layer of electrically conductive material, said layer comprising a first portion disposed over said auxiliary layer and a second portion that is disposed at said recess and extends over said insulating layer and is connected to said semiconductor zone; and
d. removing said auxiliary layer and said first portion of said conductive layer so as to leave on said semiconductor body said second portion of said conductive layer, which second portion comprises said conductor pattern.

2. A method as claimed in claim 1, wherein said surface portions of said semiconductor body accessible through said aperture are exposed prior to the provision of said first sub-layer.

3. A method as claimed in claim 1, wherein said conductive layer is produced by successively providing at least first and second layers of mutually different conductive materials, so as to form a composite layer.

4. A method as claimed in claim 3, wherein said first layer constitutes the lowermost layer of said composite conductive layer and is disposed nearest to said semiconductor body surface, said first layer consisting essentially of one of titanium, chromium, rhodium, tantalum, and tungsten.

5. A method as claimed in claim 3, wherein said second layer constitutes the uppermost layer of said composite conductive layer and consists essentially of gold.

6. A method as claimed in claim 5, wherein said first layer consists essentially of one of chromium and titanium and said method comprises the further step of providing a third layer on said first layer before the provision of said second layer, said third layer consisting essentially of one of platinum and rhodium.

7. A method as claimed in claim 1, comprising the step of providing said conductive layer from the gaseous phase and under reduced pressure, said step utilizing a local source of material and being carried out such that the transport of material for said conductive layer takes place mainly in a direction substantially perpendicular to the surface of said semiconductor body.

8. A method as claimed in claim 3, wherein said step of providing said composite conductive layer includes providing a local source of material and maintaining said source at substantially equal distance from the surface of said auxiliary layer during the provision of the component layers of said composite conductive layer.

9. A method as claimed in claim 1, wherein said auxiliary layer has a thickness which is at least equal to that of said conductive layer.

10. A method as claimed in claim 1, wherein said second sub-layer of said auxiliary comprises a metal layer which consists of a material differing from that of said first sub-layer, said second sub-layer comprising said recess second part, said method comprising the step of etching said recess first part in said first sub-layer with the use of said second sub-layer as an etching mask for said first-sub-layer that underlies said second sub-layer.

11. A method as claimed in claim 1, comprising the step of producing said first sub-layer of a greater thickness than said second sub-layer.

12. A method as claimed in claim 1, comprising the step of producing said first sub-layer essentially from one of aluminum, copper, silver and magnesium.

13. A method as claimed in claim 12, comprising the step of producing said second sub-layer essentially from one of chromium, palladium, molybdenum, tungsten, tantalum and nickel.

* * * * *